(12) United States Patent
Li et al.

(10) Patent No.: US 9,722,637 B2
(45) Date of Patent: Aug. 1, 2017

(54) CONSTRUCTION OF MBR (MINIMUM BANDWIDTH REGENERATING) CODES AND A METHOD TO REPAIR THE STORAGE NODES

(71) Applicants: PEKING UNIVERSITY SHENZHEN GRADUATE SCHOOL, Shenzhen, Guangdong (CN); Hui Li, Shenzhen, Guangdong (CN)

(72) Inventors: Hui Li, Guangdong (CN); Hanxu Hou, Guangdong (CN); Bing Zhu, Guangdong (CN)

(73) Assignees: PEKING UNIVERSITY SHENZHEN GRADUATE SCHOOL, Shenzhen, Guangdong (CN); Hui Li, Shenzhen, Guangdong (CN)

( * ) Notice: Subject to any disclaimer, the term of this patent is extended or adjusted under 35 U.S.C. 154(b) by 0 days.

(21) Appl. No.: 13/996,825

(22) PCT Filed: Mar. 26, 2013

(86) PCT No.: PCT/CN2013/073180
§ 371 (c)(1),
(2) Date: Jun. 21, 2013

(87) PCT Pub. No.: WO2014/153716
PCT Pub. Date: Oct. 2, 2014

(65) Prior Publication Data
US 2016/0006463 A1    Jan. 7, 2016

(51) Int. Cl.
*H03M 13/00*    (2006.01)
*H03M 13/15*    (2006.01)
(Continued)

(52) U.S. Cl.
CPC ....... *H03M 13/616* (2013.01); *G06F 11/1076* (2013.01); *G06F 11/1088* (2013.01);
(Continued)

(58) Field of Classification Search
CPC .......... H03M 13/1148; H03M 13/616; H03M 13/134; H03M 13/11; H03M 13/118;
(Continued)

(56) References Cited

U.S. PATENT DOCUMENTS

2011/0289351 A1\* 11/2011 Rashmi ............... G06F 11/1662
714/6.32
2012/0023385 A1\* 1/2012 Scouarnec ........ H03M 13/3761
714/763

(Continued)

OTHER PUBLICATIONS

Rashmi, K.V.; Shah, N.B.; Kumar, P.V., "Optimal Exact-Regenerating Codes for Distributed Storage at the MSR and MBR Points via a Product-Matrix Construction," in Information Theory, IEEE Transactions on , vol. 57, No. 8, pp. 5227-5239, Aug. 2011.\*

(Continued)

*Primary Examiner* — Cynthia Britt
(74) *Attorney, Agent, or Firm* — Jackson IPG PLLC; Demian K. Jackson

(57) ABSTRACT

This invention gives a coding method of MBR (Minimum Bandwidth Regenerating) codes. The related method includes the following steps: equally divide the original file of size B into $k(k+1)/2$ blocks, obtaining the first packets; construct a symmetrical $k \times k$ system matrix S with these first packets; generate k ID codes, wherein each ID code contains k elements; obtain the coded packet through operations between one column of the system matrix and the ID code; repeat the above steps with $(n-k)$ different columns of the system matrix separately to get the $(n-k)$ coded packets; construct the $(n-k) \times k$ check matrix P with the column number g which is the serial number of the ID codes in the
(Continued)

coded packet set $P_g$; store the rows of the system matrix and coded matrix to n nodes, each node stores one row. The present invention also involves a method to repair the failed nodes of the above coding scheme.

9 Claims, 4 Drawing Sheets

(51) Int. Cl.
*H03M 13/37* (2006.01)
*G06F 11/10* (2006.01)

(52) U.S. Cl.
CPC ... *H03M 13/1515* (2013.01); *H03M 13/3761* (2013.01); *G06F 2211/1028* (2013.01)

(58) Field of Classification Search
CPC . H04L 1/0057; H04L 12/5602; H04L 1/0061; H04L 1/0083; H04L 67/108; H04L 25/0242; G06F 11/1076; H04B 1/70735; H04B 7/0639; H04B 7/15521
See application file for complete search history.

(56) References Cited

U.S. PATENT DOCUMENTS

| | | | | |
|---|---|---|---|---|
| 2012/0266044 | A1* | 10/2012 | Hu | H03M 13/3761 714/763 |
| 2013/0073896 | A1* | 3/2013 | Le Scouarnec | G06F 11/1092 714/6.3 |
| 2014/0022970 | A1* | 1/2014 | Gong | H04W 52/0203 370/311 |
| 2014/0317222 | A1* | 10/2014 | Li | H04L 67/1097 709/213 |
| 2015/0127974 | A1* | 5/2015 | Jiekak | G06F 11/1092 714/6.24 |
| 2015/0142863 | A1* | 5/2015 | Yuen | H03M 13/13 707/827 |
| 2015/0358037 | A1* | 12/2015 | Li | G06F 11/1088 714/763 |

OTHER PUBLICATIONS

"Exact Minimum-Repair-Bandwidth Cooperative Regenerating Codes for Distributed Storage Systems" Kenneth W. Shum and Yuchong Hu Institute of Network Coding, Jun. 1, 2011 The Chinese University of Hong Kong.*

* cited by examiner

CONSTRUCTION OF MBR (MINIMUM BANDWIDTH REGENERATING) CODES AND A METHOD TO REPAIR THE STORAGE NODES

TECHNICAL FIELD OF THE INVENTION

This invention relates to the field of distributed storage, more specifically, relates to the construction of MSR (Minimum Storage Regenerating) codes and a method to repair the storage nodes.

BACKGROUND OF THE INVENTION

With the rapid development of computer network, the data size of network information becomes bigger and bigger, which makes the storage of magnanimity data particularly important. The traditional file storage system can no longer gratify the demand of high-capacity, high-reliability, high-performance etc. of the existing applications, the distributed storage system proved to be effective because of its efficient extendibility and high availability. However, the storage nodes in distributed storage system are unreliable. We need to introduce redundancy to the system for the sake of providing reliable service with unreliable storage nodes. The simplest redundancy is to make a direct back-up for the original data. Although direct back-up is simple, it has a low storage efficiency and system reliability, while we can improve the storage efficiency with a coding method to introduce redundancy. In the present storage system, MDS (Maximum Distance Separable) codes are generally adopted, which can reach the optimum efficiency of storage space. A (n,k) MDS error-correcting code splits the original file into k pieces of equal size, and generates n independent encoded pieces through linear coding, which are stored in n storage nodes respectively, to satisfy the MDS property (any k encoded parts are sufficient to reconstruct the original file). This coding technique occupies an important position to provide an effective network storage redundancy, particularly is appropriate for the storage of large files and the application of data back up.

In distributed storage system, a file of size B is stored in n storage nodes, each with size a. The data receiver only needs to connect to and download the data stored in arbitrary k out of n storage nodes to recover the original data B. This procedure is called reconstruction. RS (Reed-Solomon) code is a code satisfying MDS property. When a storage node is failed, we need to regenerate a new node to store the lost data in order to keep the redundancy level. This procedure is called repair process. However, during repair process, RS code firstly needs to reconstruct the original file with data of k storage nodes, then recover the lost data of the filed node for the new node. Obviously it's a waste of bandwidth to recover the whole file for the sake of recovering one node.

The failure of storage nodes and the loss of files will result in the decrease of redundancy gradually with time, therefore, we need a mechanism to ensure system redundancy. EC (Erasure Codes) proposed in the paper [R. Rodrigues and B. Liskov, "High Availability in DHTs: Erasure Coding vs. Replication", Workshop on Peer-to-Peer Systems (IPTPS) 2005.] is relatively effective on storage overhead, while it needs a rather bigger communication overhead to sustain the recovery of the redundancy. FIG. 1 shows that we can obtain the original file as long as there are d (d$\geq$k) effective nodes in the system. FIG. 2 shows the process to recover the stored file in the failed node. As can be seen from FIG. 1 and FIG. 2, the entire recovery process is: 1) download data from k storage nodes to reconstruct the original file; 2) recode the original file to generate the new fragment and store it in the new node. The recovery process shows that the required network load to repair any failed node is at least the contents stored in k nodes.

Meanwhile, in order to reduce the bandwidth used in the repair process, the paper [A. G. Dimakis, P. G. Godfrey, M. J. Wainwright, K. Ramchandran, "Network coding for distributed storage systems", IEEE Proc. INFOCOM, Anchorage, Ak., May 2007.] proposed RGC (Regenerating Codes) on the basis of network coding theory. RGC codes satisfy the MDS property as well. During the repair process of the RGC codes, a new storage node needs to connect to d nodes from the rest ones and download $\beta$ data from each node respectively, which indicates that the repair bandwidth of RGC is d$\beta$. The paper at the same time gives the functional repair model of RGC and proposes two optimal codes: MSR (Minimum-Storage Regenerating) codes and MBR (Minimum-Bandwidth Regenerating) codes. RGC codes are superior to RS codes in view of repair bandwidth, but RGC repair process needs to connect to d (d>k) storage node (d is called repair node). Moreover, the repair node needs to random linear network code its stored data. In order to meet the independence demand of all the coded packets, RGC codes should operate on a relatively large Gialois Field GF (q).

The patent PCT/CN2012/083174 proposes a practical projective self-repairing code with its coding scheme, data reconstruction and repair method. PPSRC (Practical Projective Self-repairing Codes) have two typical properties of self-repairing codes as well: the lost coded packet can be repaired with less data than the entire file downloaded from other surviving coded packet; the lost packet can be repaired from a given number of fragments, where the given number only relates to the amount of lost fragments but have nothing to do with what exactly is lost. These properties make the repair load relatively low. In addition, each node in the system has the same status which provides ability to repair different lost packets independently and concurrently in different place of the network.

Except for the above conditions, PPSRC codes also have the following properties: there are (n−1)/2 pair repair nodes to choose from when a node fails; we can still repair the failed nodes with arbitrary two of the remained (n+1)/2 nodes if (n−1)/2 nodes fail at the same time.

The coding and self-repairing process of PPSRC codes only involve XOR operations, in spite that the general PSRC (Projective Self-repairing Codes) seems relatively complex with polynomial operations, i.e. the computation complexity of PPSRC is less than PSRC. Meanwhile, PPSRC is superior to PSRC in repair bandwidth and repair nodes. The redundancy of PPSRC is controlled, which makes it suitable for general storage systems. Moreover, PPSRC has the optimal reconstruction bandwidth.

In a word, PPSRC has effectively reduced storage nodes and system redundancy, resulting in the improvement of PPSRC's use value.

PPSRC codes, however, have some shortcomings First of all, PPSRC has a complex encoding and decoding scheme, reflect in that the partition operation of Galois Field and its subfield is relatively large, and the reconstruction is rather tedious. Secondly, in PPSRC codes, coded blocks are inseparable, so that the repair blocks must be inseparable as well. Thirdly, the entire coding and decoding process of PPSRC expend a high operation complexity, the redundancy in fact is quite large even though it's controlled. Generally, a great many storage nodes are used in PPSRC, which seems entirely unnecessary for small files. These all increase the implementation difficulty in practical distributed storage systems. Thus, the PPSRC codes have a weak generality.

Hierarchical Codes (HC) is proposed in the paper [A. Duminuco, E. Biersack, "Hierarchical Codes: How to Make Erasure Codes Attractive for Peer-to-Peer Storage Systems", Peer-to-Peer Computing (P2P), 2008.] according to the property that the arbitrary third fragment can be recovered from the other two if any one of the three fragments is obtained from the other two by XOR operations. HC code is an iterative structure, we construct a large code gradually from the small EC codes through XOR operations between the sub-modules of the EC code.

Its main idea is: when considering a file with the size of s×k, we divide the file into s sub-blocks, each contains k original modules. Generate (n−k) local redundant coded modules with a (n, k) EC code in each sub-block. Through the coding scheme, further generate r global redundant coded modules with all the s×k original modules, so that we get a coded group which consists of (s×n+r) coded modules generated from s×k original modules. Local redundant modules can be used to repair the failed nodes in its sub-block so that the repair only needs less data than the whole file, while the global redundant modules provide a further repair, i.e. we can repair the failed modules with the global redundant modules when there are too many modules failed that they can't self repair. The system structure of HC codes is asymmetric so that some modules seem prior to others, resulting in that it's very difficult to make a deep analysis of resilience (it affects comprehension of coding effectiveness); it requires more complex algorithms to implement the coding scheme in actual systems (both for reconstruction and repair); the amount of modules required to repair the failed modules depend on not only how many modules are failed but also what specific ones are failed as a result that the status of different modules are different; similarly, the amount of modules required to reconstruct the original file may vary with different failed modules.

The patent PCT/CN2012/071177 proposed a RGC (Regenerating Codes) code, in which we only need a small fraction of data to repair a lost fragment, rather than reconstructing the entire file. Linear network coding is applied to RGC codes. It improves the repair expenses with the NC (Network Coding) property (i.e. max-flow min-cut). It can be proved in network information theory that network overhead with the same amount of data as the lost fragment is enough to repair the lost fragment.

The main idea of RGC codes is still MDS property. If some storage nodes are failed, which is equivalent to data loss, we need download information from the valid nodes to repair the lost fragment and store new data in new nodes. As time goes on, many original nodes may fail, some newly-regenerated nodes may participate in the repair process to generate more new nodes. Therefore, we should ensure two points during regeneration: 1) the failed nodes are independent with each other, the regeneration process can recycled; 2) arbitrary k nodes are enough to reconstruct the original file.

FIG. 2 describes the regeneration process after a node failure. Consider a distributed system with n storage nodes, where each node stores $\alpha$ packets. If a node fails, a new node download $\beta$ packets each from other d (d≥k) surviving nodes for regeneration. Each storage node can be denoted by a pair of nodes $X^i_{in}$, $X^i_{out}$ which are connected by an edge with a capacity equal to the amount of data stored at the node (i.e. $\alpha$). The regeneration process is by an information flow graph, wherein $X_{in}$ collects $\beta$ packets each from arbitrary d surviving nodes and stores $\alpha$ packets in $X_{out}$ through $$X_{in} \xrightarrow{\alpha} X_{out}. \quad X_{out}$$

can be visited by any receiver. The max-flow between the source and sink is decided by the min-cut in the graph, which should not be smaller than the original file when the sink reconstructs the original file.

There is a trade-off between the storage a of each node and required bandwidth γ to regenerate a node, therefore, we additionally introduce MBR (Minimum Bandwidth Regenerating) codes and MSR (Minimum Storage Regenerating) codes. It's obvious that the minimum storage is M/k bits, from which we can reach that in MSR codes $$(\alpha_{MSR}, \gamma_{MSR}) = \left(\frac{M}{k}, \frac{Md}{k(d-k+1)}\right) \quad (9)$$

When d reaches the maximum value, i.e. a newcomer connects to all the (n−1) surviving nodes, the repair bandwidth $\gamma_{MSR}$ can reach its minimum value $$\gamma_{MSR}^{min} = \frac{M}{k} \cdot \frac{n-1}{n-k} \quad (10)$$

MBR codes have the minimum repair bandwidth, from which we can conclude that RGC have the minimum repair overhead while d=n−1, i.e.

$$(\alpha_{MBR}^{min}, \gamma_{MBR}^{min}) = \left(\frac{M}{k} \cdot \frac{2n-2}{2n-k-1}, \frac{M}{k} \cdot \frac{2n-2}{2n-k-1}\right) \quad (11)$$

There are three models to repair the failed nodes: Exact repair: the lost fragments are required to be accurately regenerated, where the recovered message is exactly the same as the lost (core technologies are interference queue and NC); Functional repair: it's only required that the repaired system meets the MDS property even if the regenerated fragments contain different data with the failed nodes (core technology is NC); Partially exact repair: it's a hybrid repair model between exact repair and functional repair, where the system nodes (the stored un-coded data) is required to be exactly regenerated (i.e. the recovered messages should be the same as the original information stored in the failed nodes) while the non-system nodes (the coded fragments) can be functional repaired to satisfy the MDS property (core technologies are interference queue and NC).

In order to apply RGC codes to practical distributed systems, we need connect to at least k nodes to repair the failed nodes even it's not the optimal case. Therefore, RGC codes possess a high protocol overhead and a high system design complexity (NC technology) even though the required repair bandwidth is relatively low. Besides, RGC codes haven't taken engineering solutions into consideration, such as lazy repair process, which consequently can't avoid the repair bandwidth produced by the temporary failures. Finally, the NC based coding and decoding of RGC codes require a high computation expense, which is an order higher than traditional EC.

SUMMARY OF THE INVENTION

The related technology considered in this invention lies in that, confronted with the defects that operations based on the existing technologies are complex, high-expensed and require a large repair bandwidth, we propose a MBR coding scheme and a method to repair the failed storage nodes with simple operation, small overhead and small repair bandwidth.

The scheme used in the present invention to solve the above technical problems is: construct a MBR (Minimum Bandwidth Regenerating) coding method, comprising the following steps:
- A) Divide the original file of size B averagely into k (k+1)/2 blocks, each of L bits, obtaining the first packets, i.e.

$c_i = b_{i,1} b_{i,2} \ldots b_{i,L}$, $i=1, 2, \ldots, k(k+1)/2$

- B) Construct a symmetrical k×k system matrix S with the first packets, where we fill up the upper-triangular line by line successively with the sequentially obtained first packets, to generate the upper-triangular;
- C) Generate k ID codes, each of which contains k elements; add given number of zeros to the head of the first packet in a column of the system matrix in accordance with the corresponding elements of the ID code, to get k second packets; operate on the k second packets to get a coded packet; repeat the above steps with the above-mentioned column of the system matrix and different ID codes to obtain k coded packets; arrange the k coded packets according to the serial number to get a coded packet set $P_g = p_{g,1} \, p_{g,2} \ldots p_{g,k}$, where g=1, 2, ... n−k and $p_{g,k}$ is the coded packet obtained from the k-th ID code and the g-th column of the system; repeat the above steps with (n−k) different columns of the system matrix, we can then obtain (n−k) coded packet sets;
- D) Construct the (n−k)×k check matrix P, each row of which is the successively arranged coded packet set $P_g$;
- E) Store the first packets contained in each row of the system matrix into a storage node respectively, to get k system nodes; store each row of the check matrix into a storage node, to get (n−k) check nodes, where n is the total amount of the storage nodes.

Further on, the step C) further comprises the following steps:
- C1) Obtain k ID codes;
- C2) Choose an ID code and a column of the system matrix, add given number of zeros respectively to the heads of the k first packets in the chosen column according to the maximum value of the elements in the chosen ID code and the element values of the ID code corresponding to the row number in which each first packet lies, to get k second packets; obtain a coded packet through operations on the k second packets;
- C3) Repeat step C2) respectively for the chosen columns successively with different ID codes, till we get k coded packets; arrange the obtained coded packets to get a coded packet set;
- C4) Repeat step C2) and step C3) for different columns of the system matrix with the ID codes, to get (n−k) coded packet sets.

Further on, the step C1) further comprises the following steps:
- C11) Decide whether k is a prime number; if yes, execute step C12); otherwise, step C13);
- C12) According to $(r_1^a, r_2^a, \ldots, r_k^a) = (0, a, 2a, \ldots, (n-1)a) \bmod k$, $a=1, 2, \ldots, k$ substitute a=1, 2, ... , k into the sequence (0, a, 2a, ... , (n−1)a) with a modulus of k, obtaining (n−k) ID codes.
- C13) Find the minimum prime number p that is larger than k, and according to $(r_1^a, r_2^a, \ldots, r_k^a) = (a-1, 2a-1, \ldots, ka-1) \bmod p$, $a=1, 2, \ldots, p-1$ substitute a=1, 2, ... , p−1 into the sequence (a−1, 2a−1, 2a, ... , ka−1) with a modulus of p, obtaining (n−k) ID codes.

Further on, wherein the step C2) further comprises the following steps:
- C21) Find the maximum value of the ID codes, denoting as:

$r_{max} = \max(r_1^a, r_2^a, \ldots, r_n^a)$;

- C22) Add given number (equal to the y-th element value in the current ID code) of zeros to the head of the y-th first packet in the chosen column, while $r_{max} - r_y^a$ bits zeros to the end, to get a second packet, where y=1, 2, ... , k; repeat the above steps for the other (k−1) first packets in the column with a y equal to the packet's row number, to get k second packets; g is the chosen column in the system matrix, and g is among 1, 2, ... , n−k;
- C23) Add the k second packets together to get a coded packet $p_{g,j}$ which is generated by the current ID code and denotes the coded packet obtained through operations between the g-th column in the system matrix and the j-th ID code.

Further on, wherein the step C4) further comprises the following steps:
- C41) Choose the next ID code adjacent to the ID code in step C2);
- C42) Regard the above-obtained ID code which step C41) chose as the current ID code, to repeat step C2) and C3) until all the ID codes are used.

Further on, wherein the step B) further comprises the following steps:
- B1) Take out the obtained first packets in order, with which we fill up the upper-triangular of the system matrix S line by line successively, to generate the $$\text{upper-triangular} \begin{bmatrix} c_1 & c_2 & \cdots & c_k \\ & c_{k+1} & \cdots & c_{2k-1} \\ & & \vdots & \vdots \\ & & & c_B \end{bmatrix};$$

wherein B=k(k+1)/2;
- B2) Fold the above-obtained upper-triangular to get the lower-triangular so that the system matrix is denoted as $$S = \begin{bmatrix} c_1 & c_2 & \cdots & c_k \\ c_2 & c_{k+1} & \cdots & c_{2k-1} \\ \vdots & \vdots & \vdots & \vdots \\ c_k & c_{2k-1} & \cdots & c_B \end{bmatrix};$$

The check matrix is denoted as $$P = \begin{bmatrix} P_1 \\ P_2 \\ \vdots \\ P_{n-k} \end{bmatrix} = \begin{bmatrix} p_{1,1} & p_{1,2} & \cdots & p_{1,k} \\ p_{2,1} & p_{2,2} & \cdots & p_{2,k} \\ \vdots & \vdots & \vdots & \vdots \\ p_{n-k,1} & p_{n-k,2} & \cdots & p_{n-k,k} \end{bmatrix};$$

wherein, $P_1, P_2, \ldots, P_{n-k}$ are the coded packet sets obtained while step C3) is repeated in the above steps; the above step D) further comprises the following steps: combine the system matrix and the check matrix together to get a data matrix, of which each row is stored in a storage node; the data matrix is denoted as $$M = \begin{bmatrix} S \\ P \end{bmatrix}.$$

This invention also relates to a method to repair the storage nodes in the above-mentioned coding scheme, the method comprises the following steps:

I) Confirm the invalidation of the storage node, and decide whether the failed node is a system node, if yes, execute the following step; otherwise, step K);

J) Download the f-th packet stored in each remained valid system node (i.e. the packet of the system node in the f-th column of the system matrix), to get (k−1) packets of the failed node, the parameter f is the column number of the system matrix in which the failed node lies; f=1, 2, . . . , k; operate on the data downloaded from the corresponding check node according to the ID codes, to obtain the all the data of the failed node; store the obtained data in a new node to replace the failed system node;

K) Get the column number that generated the failed node, then download a packet from each system node to get the above mentioned column; code the download data with all the ID codes to get data stored in the failed node; store the obtained data into a new node to replace the failed node.

Further on, the step J) further comprises the following steps:

J1) Acquire the row number f of the failed system node, and for all remained surviving system node, download their first packets which lie in the f-th column of the system matrix;

J2) Download coded packets that stored in the check node which is generated by the f-th column of the system matrix; do inverse operations between the downloaded coded packets according to the ID codes, to get the first packets in the f-th column of the system matrix;

J3) We can obtain the lost first packets through the relation between the columns and rows of the system matrix.

Further on, wherein the step K) further comprises the following steps:

K1) Find out the row number e of the coded matrix that the failed check node lies in, e=1, 2, . . . , n−k; get k ID codes;

K2) Download the e-th first packet from k system nodes respectively, to obtain data of the e-th column of the system matrix; get the maximum value of the ID codes, i.e. $r_{max}=\max(r_1^a, r_2^a, \ldots, r_n^a)$;

K3) For the obtained e-th column, they will be coded according to the acquired ID codes, to obtain the packets stored in the failed node.

Further on, the step K3) further comprises the following steps:

K31) Get the maximum value of the mentioned ID codes, i.e. $r_{max}=\max(r_1^a, r_2^a, \ldots, r_n^a)$;

K32) Add given number (equal to the y-th element value in the current ID code) of zeros to the head of the y-th first packet in the chosen column, while $r_{max}-r_y^a$ bits zeros to the end, to get a second packet, where y=1, 2, . . . , k; repeat the above steps for the other (k−1) first packets in the column with a y equal to the packet's row number, to get k second packets; g is the chosen column in the system matrix, and g is among 1, 2, . . . , n−k;

K33) Add the k second packets together to get a coded packet $p_{g,j}$ which is generated by the current ID code and denotes the coded packet obtained through operations between the g-th column in the system matrix and the j-th ID code.

The application of the MBR coding scheme and the node repairing method proposed in this invention will bring the following beneficial effects: traditional RGC codes are based on Galois Field GF(q), and its coding and decoding processes involve addition, subtraction and multiplication on Galois Field; even though research on Galois Field operations is relatively mature, it's very tedious and long time consuming in practice; however, in this invention case, we decrease the computation complexity in the coding and decoding process thanks to the replacement of complex operations on Galois Field with simple XORs. Its coding and decoding only limit to fast XOR operations (i.e. the above additions), which greatly improves node repair and data reconstruction rate; BMBR (Binary Minimum Bandwidth Regenerating) codes not only decrease the system computation complexity, but also guarantee that the required bandwidth in the repair process is the minimum (i.e. the same size as the original file), without redundant bandwidth. In today when the bandwidth resource is more and more precious, the benefits of BMSR are obvious. BMSR codes can guarantee: the lost coded packet can be repaired with some sub-sets of other surviving coded packet; the lost packet can be repaired with a give number of fragments, where the given number only relates to the amount of lost fragments but have nothing to do with what exactly is lost. At the same time, data stored in the repaired node is the same as that in the original failed node of BMSR codes, which is called exact repair, that has decreased system operation complexity to a great extent. To sun up, the code works with simple operations, small overhead and small repair bandwidth.

DESCRIPTION OF PREFERRED EMBODIMENTS

The invention case will be further described in conjunction with the figures.

Figure 1:
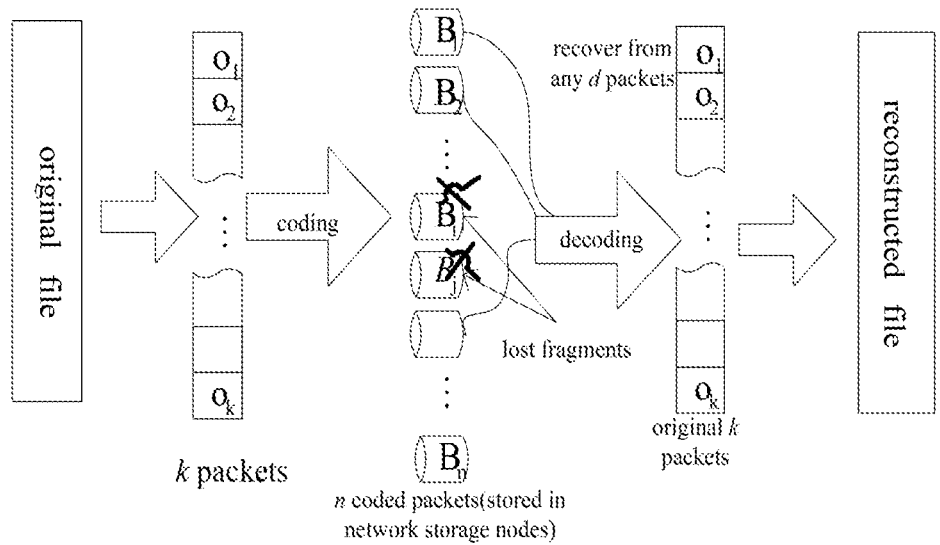
FIG. 1 illustrates the schematic diagram of data reconstruction of EC codes in the existing technology.
Figure 2:
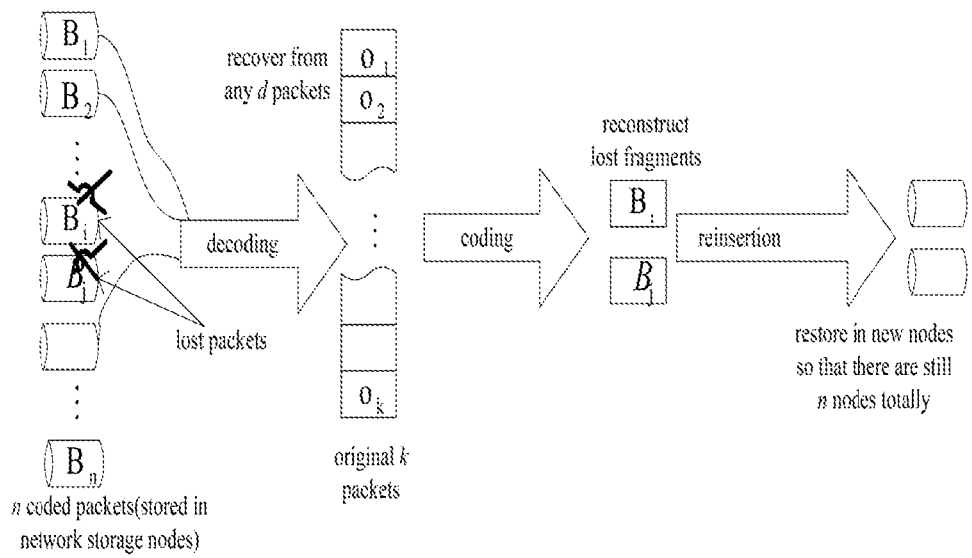
FIG. 2 illustrates the schematic diagram of the repair process of failed storage nodes in EC codes in the existing technology.
Figure 3:
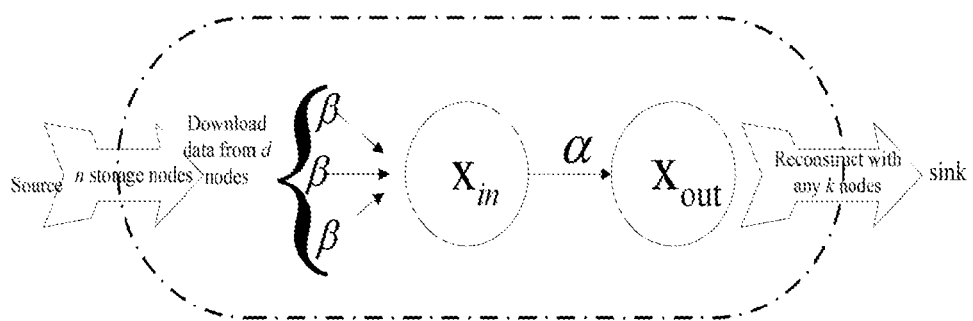
FIG. 3 illustrates the schematic diagram of the regeneration of RGC codes in the existing technology.
Figure 4:
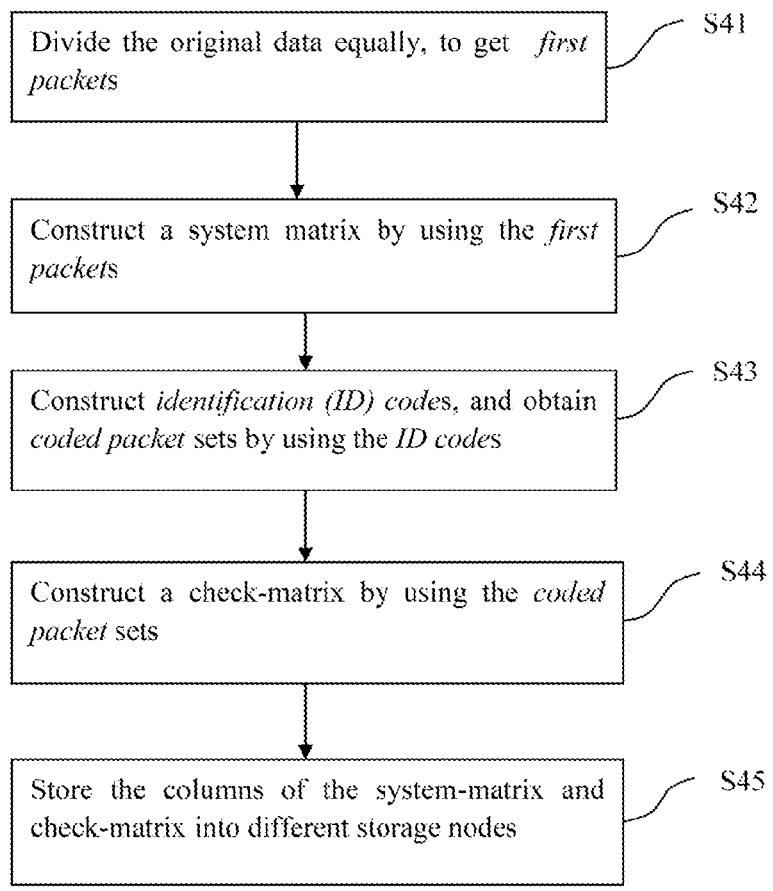
FIG. 4 illustrates the flow chart of the coding scheme in the implementation case of MBR codes and the node repair method in this invention.
Figure 5:
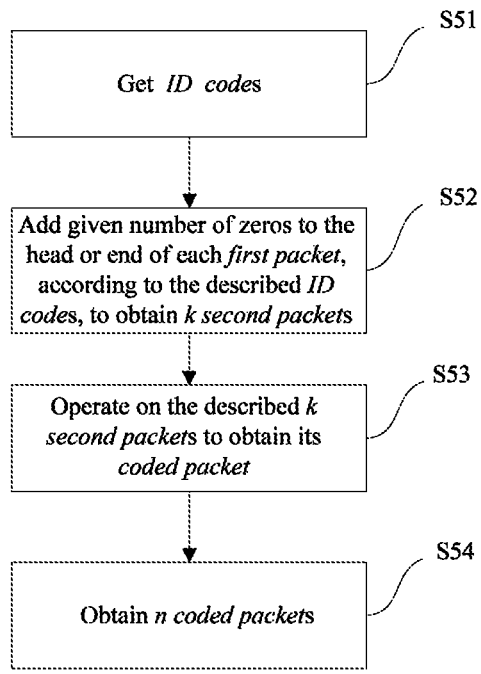
FIG. 5 illustrates the flow chart of the obtaining of the coded packets in the present invention.

As shown in FIG. 4, in this invention case of the coding scheme and node repair method of MSR codes, the coding method of the MSR code comprises the following steps:

Step S41 equally divides the original file, obtaining the first packets: in this step, we divide the original file of size B averagely into k (k+1)/2 blocks, each of L bits, obtaining the first packets, denoted as $$c_i = b_{i,1} b_{i,2} \ldots b_{i,L}, i=1,2,\ldots,k(k+1)/2;$$

in this invention case, for the sake of simplicity, as an example, we set the block size L to be 1 bit, so that there is one bit in each first packet, i.e. $c_i = b_{i,1}$; therefore, in this invention case, the above parameter B is equal to k (k+1)/2, i.e. B=k (k+1)/2.

Step S42 constructs the system matrix with the obtained first packets: in this step, we construct a symmetrical k×k system matrix S with the above-obtained first packets, where we fill up the upper-triangular line by line successively with the sequentially obtained first packets, to generate the upper-triangular. That is to say, in this step, we get a system matrix S through the first packets obtained in the above step. In this invention case, the system matrix is symmetric, i.e. if the diagonal line of the matrix is set to be the axis, elements on each side of the axis are symmetric. Thus, in this invention, we firstly obtain the upper-triangle, and then fold it to get the whole system matrix. The method to get the upper-triangle of the system matrix is: take out the first packets successively according to their serial number (i.e. its subscript i in the formula), then put the first packet whose i=1 in the position of Row 1 Column 1 in the system matrix, put the first packet whose i=2 in the position of Row 1 Column 2 in the system matrix, put the first packet whose i=3 in the position of Row 1 Column 3 in the system matrix, and so on, we get the first column of the system matrix till the k-th first packet; because we are constructing the upper-triangle of the matrix, the first packet is put in the position of Row 2 Column 2 of the system matrix S when i=k+1, according to this method, the (k+2)-th first packet is put in Row 2 Column 3, . . . , Row 2 Column k for the (2k−1)-th first packet. In short, when constructing the upper-triangle, we fill in the first column of the system matrix S with k first packets ($c_1$ to $c_k$), the second column with (k−1) first packets ($c_{k+1}$ to $c_{2k-1}$), the third column with (k−2) first packets ($c_{2k}$ to $c_{3k-2}$), . . . , the k-th column with one first packet ($c_B$), therefore, there are totally k+(k−1)+(k−2)+(k−3)+ . . . +2+1=k(k+1)/2 first packets in the upper-triangle of the system matrix S, which exactly uses up the first packets obtained in the above step. We then get the system matrix by folding the obtained upper-triangle along the diagonal. That is to say, in this invention, we take out the obtained first packets in order, with which we fill up the upper-triangular of the system matrix S line by line successively, to generate the upper-triangular $$\begin{bmatrix} c_1 & c_2 & \ldots & c_k \\ & c_{k+1} & \ldots & c_{2k-1} \\ & & \vdots & \vdots \\ & & & c_B \end{bmatrix};$$

wherein B=k(k+1)/2;
then fold the above-obtained upper-triangular to get the lower-triangular so that the system matrix is denoted as $$S = \begin{bmatrix} c_1 & c_2 & \ldots & c_k \\ c_2 & c_{k+1} & \ldots & c_{2k-1} \\ \vdots & \vdots & \vdots & \vdots \\ c_k & c_{2k-1} & \ldots & c_B \end{bmatrix};$$

Step S43 constructs ID codes, and gets the coded packet set with the ID codes: in this step, we generate k ID codes, each of which contains k elements (the construction of ID codes will be expatiated later on); then, add given number of zeros to the head of the first packet in a column of the system matrix S in accordance with the corresponding elements of the ID code, to get k second packets; operate on the k second packets to get a coded packet; repeat the above steps with the above-mentioned column of the system matrix and different ID codes to obtain k coded packets; arrange the k coded packets according to the serial number to get a coded packet set $P_g = p_{g,1} p_{g,2} \ldots p_{g,k}$, where g=1, 2, . . . , n−k and $p_{g,k}$ is the coded packet obtained from the g-th ID code and the k-th column of the system; then repeat the above steps with (n−k) different columns of the system matrix to obtain (n−k) coded packet sets. In other words, in this invention case, add zeros to the first packets in a certain row according to a certain ID code (e.g. the ID code with the serial number 1) to get k second packets, and we can obtain a coded packets through XOR operations between the k second packets; deal as the above steps with the same column according to successively different ID codes to obtain k coded packets; sequentially arrange the coded packets in accordance with the corresponding ID codes to obtain a coded packet set. Repeat the above steps with other (n−k−1) columns in the system matrix to obtain (n−k) coded packet sets totally. It deserves to be mentioned that in this invention we can choose the first to the (n−k)-th columns successively to realize the above steps.

Step S44 constructs the check matrix with the coded packet sets: in this step, we construct a (n−k)×k check matrix P, whose rows are the successively arranged coded packet sets $P_g$; i.e. each row of the check matrix P is a coded packet set obtained in the above steps; the first columns in each row are the coded packets obtained from the first ID code, the second columns in each row are the coded packets obtained from the second ID code, and so on, the k-th columns in each row are the coded packets obtained from the k-th ID code; different rows in the check matrix are the coded packet sets obtained from different columns of the system matrix S; generally, the rows of the check matrix are arranged in accordance with the order of the column number of the system matrix S; for instance, the coded packet set obtained from the first column of S is the first row in the check matrix P, the coded packet set obtained from the second column of S is the second row in the check matrix P, the coded packet set obtained from the third column of S is the third row in the check matrix P, and so on.

Step S45 stores each row of the system matrix and check matrix in different storage nodes: in this step, store the first packets in each row of the system matrix in a storage node respectively, to get k system nodes; store each row of the check matrix in a storage node to obtain (n−k) check nodes, through which we realized coding and storing. n is the total number of storage nodes.

In the step S43 in this invention, the obtaining of the coded packets specifically comprises the following steps:

Step S51 gets the ID codes: in this step, we obtain k ID codes (specific steps to get the ID codes will be expatiated later on). Each ID code contains k elements, which indicate the number of zeros added to the heads of the first packets corresponding to the elements when second packets are generated.

Step S52 add given number of zeros to the heads of the first packets in according with the ID codes: in this step, we firstly choose a certain column of the system matrix, e.g. the first column of S; then we choose an ID code, e.g. the first ID code which contains k elements; we can then obtain k second packets through operating on the chosen column in according with the chosen first ID code. The operating process is as follows: add given number of zeros to the first first packet in the first column where the given number equals to the first element of the chosen ID code; find the maximum value of the elements in all the ID codes, and then subtract the first element of the above ID code from the maximum value to get a certain value; of which we add the number of zeros to the end of the first first packet in the chosen column to get a second packet; the number of zeros added to the end of the packet is $r_{max}-r_i^a$, where $r_{max}=\max(r_1^a, r_2^a, \ldots, r_n^a)$ is the maximum value of the elements in all the ID codes which is calculated in advance and generally is k−1; $r_i^a$ is the current element in according with the first packet during this operation. Thus we obtain a second packet (e.g. corresponds to the first packet in Column 1 Row 1 of the system matrix S); repeat the above step for the first packets in different rows of the chosen column of the system matrix S to obtain k second packets.

Step S53 operates on the above-obtained k second packets to get the coded packet: in this step, as mentioned above, we obtain k second packets from the chosen column of the system matrix S with an ID code, in this step, we operate on the above-obtained k second packets to get a coded packet. It deserves to be mentioned that operations and additions in this step all denote XORs between each other. Repeat the above steps S52 and S53 for the above-chosen column of S with the remained (k−1) ID codes to get totally k coded packets which are obtained from the same column of the system matrix S with different ID codes. Arrange the k coded packets as one row in according with the corresponding serial numbers of the ID codes to obtain a coded packet set.

Step S54 gets (n−k) coded packet sets: repeat steps S52 and S53 for different columns of the system matrix, till we obtain (n−k) coded packet sets which make the redundancy symbols. Arrange the coded packet sets as one column in according with the column numbers that are used when generating the sets (in general, we choose Column 1, 2, 3, . . . , (n−k) successively in the system matrix S), then we finally obtain the coded matrix P.

Figure 8:
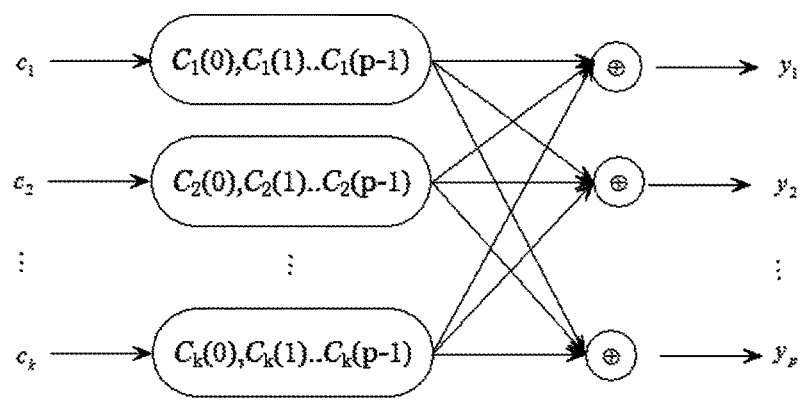
FIG. 8 illustrates the schematic diagram of the obtaining of the coded packets in the present invention.

Moreover, in this invention case, the process to obtain the coded packets is shown in FIG. 8 which illustrates the conversion relationship among first packets, second packets and coded packets.

Figure 6:
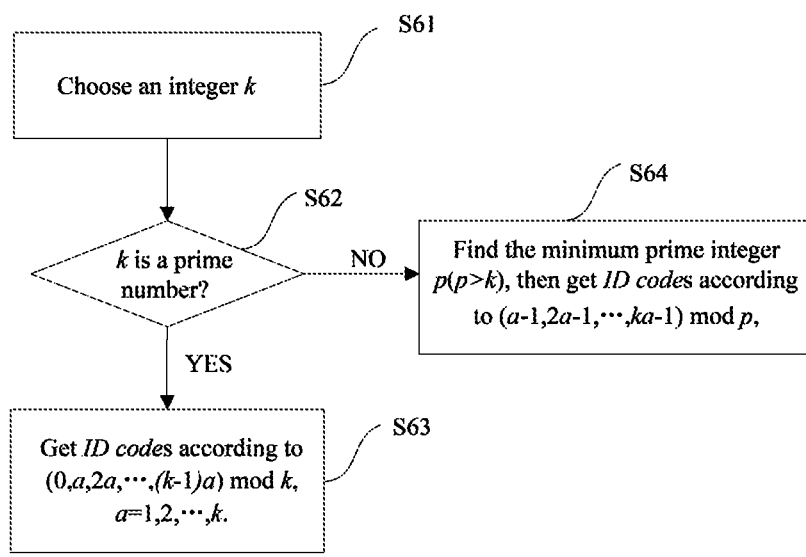
FIG. 6 illustrates the flow chart of the obtaining of the ID codes in the present invention.
Figure 7:
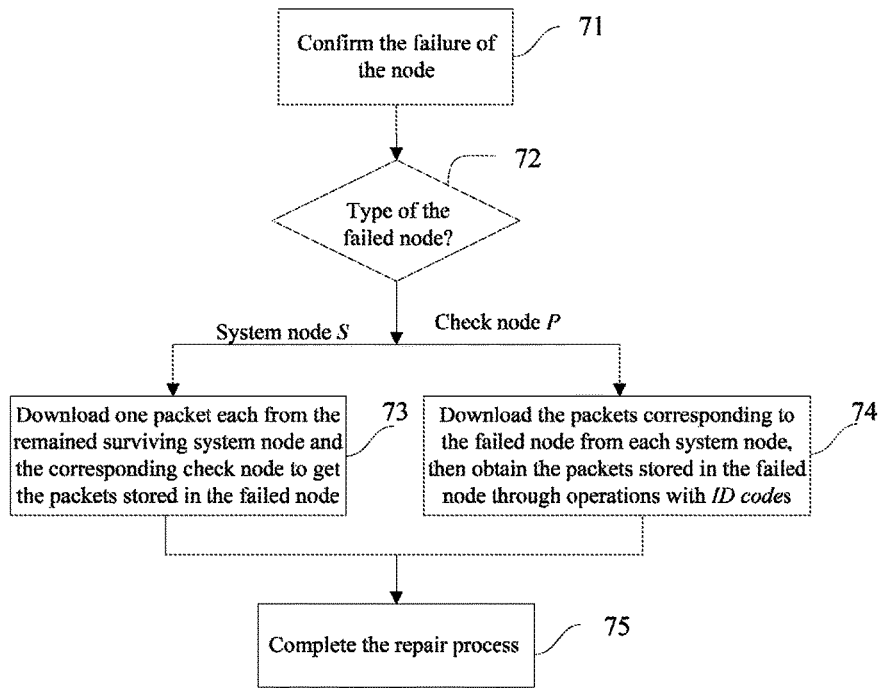
FIG. 7 illustrates the flow chart of repair of the storage nodes in the present invention.

FIG. 6 illustrates the specific steps to obtain the coded packets in this invention case, includes:

Step S61 decides whether k is a prime number, if yes, execute step S62, otherwise, S63; in this invention case, k is the one in which we divide the original file into k (k+1)/2 pieces, and it's determined in advance.

Step S62 gets k ID codes according to $$(r_1^a, r_2^a, \ldots, r_k^a) = (0, a, 2a, \ldots, (n-1)a) \bmod k, \ a=1, 2, \ldots, k:$$

in this invention case, as above, substitute a=1, 2, . . . , k into the sequence (0, a, 2a, . . . , (n−1)a) with a modulus of k respectively, obtaining kID codes. Substitute each a into the sequence with modulus operation to get an ID code, where the value of a is exactly the serial number of the ID codes.

Step S63 finds the minimum prime number p that is larger than k and get k ID codes according to $$(r_1^a, r_2^a, \ldots, r_k^a) = (a-1, 2a-1, \ldots, ka-1) \bmod p, \ a=1, 2, \ldots, p-1:$$

substitute a=1, 2, . . . , p−1 respectively into the sequence (a−1, 2a−1, 2a, . . . , ka−1) with a modulus of p, obtaining k ID codes. Substitute each a into the sequence with modulus operation to get an ID code, where the value of a is exactly the serial number of the ID codes.

There will always be node failures in actual distributed storage systems. At this time, new nodes should be introduced to substitute the failed nodes in order to keep system redundancy in a certain range. The process is called node regeneration. In this invention case, to regenerate a failed node and minimize the repair bandwidth, we can do as follows:

Step S71 confirms the node failure: in this step, we confirm that a certain node fails.

Step S72 decides the type of the failed node: in this step, we decide the type of the failed node, with regard to this invention case, there are two types: one is system node, which stores a row of the system matrix, and there are totally k system nodes; the other is check node, which stores a row of the check matrix P, and there are totally (n−k) check nodes; in this step, we judge that whether the failed node is a system node or a check node, if it's a system node, we should further find out the serial number of the failed node in all the system nodes, for example, if the f-th system node fails, where f values between 1 and k, we next execute step S73; if it's a check node, we should further find out the serial number of the failed node in all the check nodes, for example, if the i-th check node fails, where i values between 1 and (n−k), we next execute step S74. It deserves to be mentioned that the judge method bases on actual disposition of the nodes. For instance, in this invention case, there are totally n storage nodes, among which the first k are system nodes while the subsequent (n−k) are check nodes. When allocating storage nodes or data stored in these nodes, the allocation information will be recorded, which is usually stored in the form of metadata. The system here can be comprehended as a server, which is in charge of scheduling, management and the judging of node failures. Therefore, we can get the information that a storage node is a system node or a check node, and the corresponding original column of the system matrix as well.

Step S73 downloads the f-th packet of each remained surviving system node and data in the corresponding check node to recover data stored in the failed node: in this step, we download the f-th packet stored in each remained valid system node (i.e. the packet of the system node in the f-th column of the system matrix), to get (k−1) packets of the failed node (we assume that the node will be repaired immediately when it's found failed), the parameter f is the column number of the system matrix in which the failed node lies; f=1, 2, . . . , k; operate on the data downloaded from the corresponding check node according to the ID codes, to obtain the all the data of the failed node; store the obtained data in a new node to replace the failed system node. In this step, we can always get the corresponding original column for every failed node, because the related coding information of the failed node can be obtained from the above-mentioned system.

That is to say, in this step, we acquire the row number f of the failed system node, and for all remained surviving system node, download their first packets which lie in the f-th column of the system matrix; download coded packets that stored in the check node which is generated by the f-th column of the system matrix; do inverse operations between the downloaded coded packets according to the ID codes, to get the first packets in the f-th column of the system matrix; then we can obtain the lost first packets through the relation between the columns and rows of the system matrix.

Step S74 gets the column number corresponding to the failed node in the system matrix, and download the column with which we obtain the data stored in the failed check node through coding: in this step, we firstly get the column number e, (e=1, 2, . . . , n−k) that generated the failed node (the coded packet set stored in this failed node is obtained through operations between the packets in the mentioned column of the system matrix according to ID codes), then download a packet from each system node to get the above mentioned column (i.e. the e-th column of the system matrix); code the download data with all the ID codes (the same operations as coding) to get data formerly-stored in the failed node; store the obtained data into a new node to replace the failed node.

Step S75 finishes the repair process: we execute this step after step S73 or S74, substituting the new storage node for the failed node detected in the above step to accomplish node repair.

That is to say, for the failure of check nodes, we need to find out the row number e of the coded matrix that the failed check node lies in, e=1, 2, . . . , n−k; and then get k ID codes (the ID codes are known and stored in advance); then download the e-th first packet from k system nodes respectively, to obtain data of the e-th column of the system matrix; for the obtained e-th column, they will be coded according to the acquired ID codes, to obtain the packets stored in the failed node.

When coding, we firstly get the maximum value of the mentioned ID codes, i.e. $r_{max}=\max(r_1^a, r_2^a, \ldots, r_n^a)$; add given number (equal to the y-th element value in the current ID code) of zeros to the head of the y-th first packet in the chosen column, while $r_{max}-r_y^a$ bits zeros to the end, to get a second packet, where y=1, 2, . . . , k; repeat the above steps for the other (k−1) first packets in the column with a y equal to the packet's row number, to get k second packets; g is the chosen column in the system matrix, and g is among 1, 2, . . . , n−k; add the k second packets together to get a coded packet $p_{g,j}$ which is generated by the current ID code and denotes the coded packet obtained through operations between the g-th column in the system matrix and the j-th ID code.

In this invention case, the k original packets (each with L bits), might as well be denoted as $c_i=b_{i,1} b_{i,2} \ldots b_{i,L}$, i=1, 2, . . . , k. The difficulty lies in successfully finding out (n−k) independent coded packets that make arbitrary k out of n packets (include original packets and coded packets) are linearly independent. We generally call the packets that meet the above conditions (n, k) independent.

The following simple example is based on a file B={$c_1$, $c_2$}, which contains two packets $c_1$, $c_2$. It's obvious that there are three linear independent packets {$c_1$, $c_2$, $c_1 \oplus c_2$} if XOR coding is applied. However, this can't meet the requirements of distributed storage systems. If we add one bit '0' to the head and one bit '0' to the end of the packet $c_1$, denoting the changed packet as $c_i(r_i)$ where $r_i$ is the number of zeros added to the head of the packet $c_i$, the packets and coded packet after changing are linear independent in terms of the above three packets.

Generally speaking, k original packets (with a length of L bits) are might as well denoted as $c_i=b_{i,1} b_{i,2} \ldots b_{i,L}$, i=1, 2, . . . , k, while the coded packet $y_a$ is given by the following: $y_a=c_1(r_1) \oplus c_2(r_2) \oplus \ldots \oplus c_k(r_k)$. The total number of zeros added to both the head and the end of each packet $c_i$ is $r_{max}=\max\{r_1, r_2, \ldots, r_k\}$. The unique ID code for the coded packet $y_a$ is $ID_a=(r_1^a, r_2^a, \ldots, r_k^a)$. It can be seen that adding $r_i$ redundancy bits to the head of the packet $c_i$ equals to the operation $c_i(r_i)=2^{r_{max}-r_i}c_i$.

For any prime number k, the unique ID code of the coded packet $y_a$ can be represented as $$ID=(r_1^a, r_2^a, \ldots, r_k^a)=(0, a, 2a, \ldots, (k-1)a) \bmod k, \quad a=1,2,\ldots,k. \tag{12}$$

then packets {$c_1$, $c_2$, . . . , $c_k$, $y_1$, $y_2$, . . . , $y_{n-k}$} obtained from the above coding method are linear independent. For instance, if k=5, the corresponding ID codes are $ID_1$=(0, 1, 2, 3, 4)$_1$, $ID_2$=(0, 2, 4, 1, 3)$_2$, $ID_3$=(0, 3, 1, 4, 2)$_3$, $ID_4$=(0, 4, 3, 2, 1)$_4$, $ID_5$=(0, 0, 0, 0, 0)$_5$.

Similarly, for a non-prime positive integer k, we can choose the minimum prime number p which is larger than k. Then the ID code can be denoted as $$(r_1^a, r_2^a, \ldots, r_k^a)=(a-1, 2a-1, \ldots, ka-1) \bmod p, \quad a=1, 2, \ldots, p-1.$$

$$(r_1^p, r_2^p, \ldots, r_{k-1}^p)=(0, 0, \ldots, 0).$$

For instance, when k=4, we choose p=5, then the corresponding ID codes are $ID_1$=(0, 1, 2, 3)$_1$, $ID_2$=(1, 3, 0, 2)$_2$, $ID_3$=(2, 0, 3, 1)$_3$, $ID_4$=(3, 2, 1, 0)$_4$, $ID_5$=(0, 0, 0, 0)$_5$.

In summary, for an arbitrary positive integer k: if k is a prime number, we can generate (n, k) linear independent packets by adding (k−1) bits zeros to k original packets. If k is not a prime integer, we can as well generate the (n, k) linear independent packets, while we now add (p−2) bits zeros to the original packets (p is a prime number larger than k).

MBR code with parameters (n, k, d) generally contains n nodes, denoted as {$N_1$, $N_2$, . . . , $N_n$}. BMBR code applies in the system that contains n nodes, each of which stores k packets. We choose any k nodes to store the original file ({$S_i$}$_{i=1, 2, \ldots, k}$), which is called system code; then the other (n−k) nodes are usually called check nodes in which coded packets are stored.

The data object of size B is divided into k (k+1)/2 packets of equal size L bits. Let S be a (k×k) symmetric system matrix whose upper-triangle is filled up with the set {$c_i$}$_{i=1, 2, \ldots, B}$. Since S is strictly symmetric, the full system matrix S can be represented as $$S = \begin{bmatrix} S_1 \\ S_2 \\ \vdots \\ S_k \end{bmatrix} = \begin{bmatrix} c_1 & c_2 & \cdots & c_k \\ c_2 & c_{k+1} & \cdots & c_{2k-1} \\ \vdots & \vdots & \vdots & \vdots \\ c_k & c_{2k-1} & \cdots & c_B \end{bmatrix},$$

Similarly, the check matrix P is represented as $$P = \begin{bmatrix} P_1 \\ P_2 \\ \vdots \\ P_{n-k} \end{bmatrix} = \begin{bmatrix} p_{1,1} & p_{1,2} & \cdots & p_{1,k} \\ p_{2,1} & p_{2,2} & \cdots & p_{2,k} \\ \vdots & \vdots & \vdots & \vdots \\ p_{n-k,1} & p_{n-k,2} & \cdots & p_{n-k,k} \end{bmatrix},$$

wherein $P_{i,j}$ is the coded packet obtained through XOR operations between the packets of a unique ID code (0, i, 2i, . . . , (k−1)i)$_i$ mod k. For example, when k=3, $$S = \begin{bmatrix} S_1 \\ S_2 \\ S_3 \end{bmatrix} = \begin{bmatrix} c_1 & c_2 & c_3 \\ c_2 & c_4 & c_5 \\ c_3 & c_5 & c_6 \end{bmatrix}.$$

If L=3, the packet file to be stored can be denoted as $$M = \begin{bmatrix} S \\ P \end{bmatrix}.$$

If a system node $S_i$ (i=1, 2, . . . , k) fails, we need to introduce a new node to replace it, while we can download a packet from each one of any k nodes for repairing. Specifically, all the chosen nodes transmit the i-th packet to the new node. If a check node $P_i$ (i=1, . . . , n−k) fails, we need to introduce a new node to replace it as well, while we can download one packet from each system node for coding. The coding process adopts the ID code of the failed node and transmits the coded packet to the new node. As can be seen obviously, data stored in the repaired node are the same as the failed node, since the ID code during the repair process is exactly the same as the failed node.

BMBR code can always exactly repair the failed node whether it's a system node or a check node, and satisfy the bandwidth boundary of min-cut. Therefore, BMBR is optimal with regard to repair bandwidth.

BMBR code is as well a kind of MBR code, which satisfies all the MDS properties. That is to say, the original file B can be recovered from any k nodes. The needed bandwidth during the regenerating process is generally $k^2$, which is obvious not the optimal. We will give the optimal regenerating process which needs the least repair bandwidth as follows.

The optimal regeneration is shown as follows: the data collector (DC) can download any k packets from the first column of the data matrix M, then any (k−1) packets from the second column, any (k−2) packets from the third column, till only one packet from the k-th column. It can be seen from the construction of BMBR, k packets in any column of the matrix M are mutually independent. Meanwhile, since S is symmetric, we can see that the packets chosen for regeneration are from the lower-triangle of S and check matrix P. Therefore, DC can acquire B linearly independent packets to finally decode out the original file.

It's observed from the above regeneration that the amount of data downloaded during the whole process is exactly the size of the original file B, which reaches the theoretical optimal repair bandwidth.

When evaluating the performance of BMBR, we mainly analyze and compare computation complexity of coding, decoding and repairing between BMBR code proposed in this invention case and traditional RGC and RS codes.

Coding Computation Complexity

For BMBR codes, there are totally (n−k) check nodes each stores k coded packets, where each packet is obtained from k original packets through XOR operations. Therefore, coding computation complexity is k(n−k)(k−1) XOR operations.

As for RGC (based on GF(q)), similarly, there are (n−k) check nodes in the system each stores k coded packets. The difference is that the coded packets are obtained by XOR operations between corresponding polynomial coefficients chosen on GF(q) according to k original packets. Thus, coding computation complexity of traditional RGC code is k(n−k)(k−1) XOR operations, additionally with $k^2(n-k)$ multiplications on Galois Field GF(q).

With regard to RS codes, the size of the original file is B=k (k+1)/2 while each node can only store one packet. We generally need to store (k+1)/2 times data that RS (n, k) code needs in order to store the file B. The coding process of RS code is similar to RGC, therefore the coding computation complexity of RS code is (k−1)(k+1)(n−k)/2 XOR operations and k(k+1)(n−k)/2 multiplications on Galois Field GF(q).

Repairing Computation Complexity

For the repair process of BMBR codes, if a system node and a check node fail at the same time, the system node can be regarded to possess a higher priority than the check node. In other words, the failed system node will be repaired before the check node. In order to repair a system node, we at least need one check node while at most k check nodes, thus the computation complexity to repair a system node is at least (k−1), at most k(k−1) XOR operations. It needs k system nodes to repair a check node, thus the computation complexity to repair a check node is k(k−1) XORs.

In order to repair a RGC node, k assistant nodes collect k packets together into the newly introduced node, in which we regenerate the former failed packet through operations on the k packets. Therefore, computation complexity of the whole repair process is at least $2k^2$ multiplications on Galois Field and (2k(k−1)) XORs.

For RS codes, in order to repair a failed node we need to download data that has the same size as the original file to reconstruct the original file, after which we generate the packet that is stored in the failed node through coding. Computation complexity of repairing is $(k^2(k+1)/2+k)$ multiplications on Galois Field and $(k^2(k+1)/2+k-1)$ XORs.

Decoding Computation Complexity

In order to recover the original file, BMBR codes need k (k−1)(k+1)/2 XOR operations. Similarly, the decoding computation complexity of RGC codes is $k^3$ multiplications on Galois Field and $k^3$ XORs, while that of RS codes is $k^2(k+1)/2$ multiplications on Galois Field and $k^2(k+1)/2$ XORs.

We summarize the computation complexity of coding, decoding and repairing of BMBR, traditional RGC and RS codes in the following table:

| Codes | Encoding Computation | Repairing Computation | Decoding Computation |
|---|---|---|---|
| BMSR | $k(k-1)(n-k) \cdot X$ | $k(k-1) \cdot X$ | $k(k^2-1)/2 \cdot X$ |
| RS | $(k^2-1)(n-k)/2 \cdot X$ $(k^2+k)(n-k)/2 \cdot M$ | $(k^2(k+1)/$ $2+k-1) \cdot X$ $(k^2(k+1)/2+k) \cdot M$ | $k^2(k+1)/2 \cdot X$ $k^2(k+1)/2 \cdot M$ |
| RGC | $k(k-1)(n-k) \cdot X$ $k^2(n-k) \cdot M$ | $2k(k-1) \cdot X$ $2k^2 \cdot M$ | $k^3 \cdot X$ $k^3 \cdot M$ |

In the table, BMSR, RGC and RS denote the codes, X denotes XOR operation and M denotes multiplications on Galois Field.

Compared with traditional RGC codes, the biggest advantage of BMBR codes proposed in this invention case lies in that BMSR has greatly decreased the computation complexity during coding and decoding, resulting from the substitution of simple XOR operations for complex operations on Galois Field. The construction of traditional RGC codes is based on Galois Field GF(q), additions, subtractions and multiplications of Galois Field are involved in the coding and decoding processes. Even though research on Galois Field operations is relatively mature, it's very tedious and long time consuming in practice, which obviously cannot meet the fast and reliable design criterions in today's distributed storage systems. However, BMBR code performs different. Its coding and decoding only limit to fast XOR operations, which greatly improves node repair and data reconstruction rate, resulting in a high application value and development potential in practical distributed storage systems.

BMBR (Binary Minimum Bandwidth Regenerating) codes not only decrease the system computation complexity, but also guarantee that the required bandwidth in the repair process is the minimum (i.e. the same size as the original file), without redundant bandwidth. In today when the bandwidth resource is more and more precious, the benefits of BMSR are obvious. BMSR codes can guarantee: the lost coded packet can be repaired with some sub-sets of other surviving coded packet; the lost packet can be repaired with a give number of fragments, where the given number only relates to the amount of lost fragments but have nothing to do with what exactly is lost. At the same time, data stored in the repaired node is the same as that in the original failed node of BMSR codes, which is called exact repair, that has decreased system operation complexity to a great extent (e.g. metadata update, data broadcast after updating).

The above mentioned cases only expressed some modes of execution of this invention, whose description is relatively specific and detailed but cannot consequently be considered as the restrictions of this invention. It should be pointed out that, for the ordinary technical persons in this field, there can be some deformations and improvements under the premise of not departing from the inventive concept which are within the protection scope of this invention. Therefore, the protection scope of this invention patent should be subject to the attached claims.

What is claimed is:

1. A coding method of Minimum Bandwidth Regenerating codes and repairing storage nodes in a distributed data storage system comprising the following steps:
   A) equally dividing an original file in a distributed data storage system of size B averagely into $k(k+1)/2$ blocks, obtaining first packets denoted as $c_i=b_{i,1} b_{i,2} \ldots b_{i,L}$, $i=1, 2, \ldots, k(k+1)/2$;
   B) constructing a symmetrical k×k system matrix S by using the first packets chosen sequentially according to serial number, and generating an upper-triangle of a distributed data storage system matrix by filling up the upper-triangle with the chosen first packets line by line successively according to an order of a column where elements of the system matrix are stored;
   C) generating k ID codes, each of which contains k elements; adding a given number of zeros to a head or end of the first packet in a column of the system matrix, wherein the given number of zeroes is equal to a first element of a respective ID code, to get k second packets; operating on the k second packets to get a coded packet; repeating the above steps with the columns of the system matrix by using different ID codes to obtain k coded packets; arranging the k coded packets according to the serial number to get a coded packet set $P_g=p_{g,1} p_{g,2} \ldots p_{g,k}$, where $g=1, 2, \ldots, n-k$, $p_{g,k}$ is the coded packet obtained from the k-th ID code and the g-th column of the system; repeating the above steps with (n−k) different columns of the system matrix, to obtain (n−k) coded packet sets;
   D) constructing a (n−k)×k check matrix P, each row of which is the successively arranged coded packet set $P_g$;
   E) storing the first packets contained in each row of the system matrix to a storage node respectively, to get k system nodes; storing each row of the check matrix to a storage node, to get (n−k) check nodes, wherein n is the total amount of storage nodes;
   F) confirming invalidation of the storage nodes, and deciding whether each failed node is a system node, if yes, executing step G); otherwise, executing step H);
   G) downloading the f-th packet stored in each remained surviving system node i.e. the packet of the system node in the f-th column of the system matrix, to get (k−1) packets of the failed node, wherein f is the row number of the system matrix in which the failed node lies; $f=1, 2, \ldots, k$; choosing the check node corresponding to the column and downloading data from the chosen node, operating on the data downloaded from the check node according to the ID codes; and then obtaining all the data of the failed node through combining the obtained data in the column of system matrix stored in the failed system node; storing the obtained data in a new node to replace the failed system node; and
   H) getting the column number of the system matrix corresponding to the failed node, then downloading a packet from each system node to get the above mentioned column; coding the downloaded data with all the ID codes to get data stored in the failed node; storing the obtained data into a new node to replace the failed node.

2. The method of claim 1, wherein the step C) further comprises the following steps:
   C1) obtaining k ID codes;
   C2) choosing an ID code and a column of the system matrix, adding the given number of zeros respectively to the heads or ends of the k first packets in the chosen column according to the maximum value of the elements in the chosen ID code and the element values of the ID code corresponding to the row number in which each first packet lies, to get k second packets; and then obtaining a coded packet through operations on the k second packets;
   C3) repeating step C2) respectively for the chosen columns of the system matrix successively, by using different ID codes, until (n−k) coded packets are obtained; arranging the obtained coded packets to get a coded packet set; and
   C4) choosing k different columns of the system matrix successively, and then repeating step C2) and step C3) by using the ID codes, to get (n−k) coded packet sets.

3. The method of claim 2, wherein the step C1) further comprises the following steps:
   C11) checking whether k is a prime number; if yes, executing step C12); otherwise, executing step C13);
   C12) according to $$(r_1^a, r_2^a, \ldots, r_k^a)=(0,a,2a,\ldots,(n-1)a) \bmod k, a=1, 2, \ldots, k$$

substituting $a=1, 2, \ldots, k$ into the sequence (0, a, 2a, ..., (n−1)a) with a modulus of k respectively, obtaining (n−k) ID codes;
   C13) finding the minimum prime number p that is larger than k, and according to $$(r_1^a, r_2^a, \ldots, r_k^a)=(a-1,2a-1,\ldots,ka-1) \bmod p, a=1, 2, \ldots, p-1,$$

substituting $a=1, 2, \ldots, p-1$ respectively into the sequence (a−1, 2a−1, 2a, ..., ka−1) with a modulus of p, obtaining (n−k) ID codes.

4. The method of claim 3, wherein the step C2) further comprises:
   C21) finding the maximum value of the ID codes, denoting as $$r_{max}=\max(r_1^a, r_2^a, \ldots, r_n^a)$$

C22) adding a given number of zeros to the head of the y-th first packet in the chosen column of the system matrix, wherein the given number equals to the y-th element value in the current ID code, while adding $r_{max}-r_y^a$ zeros to the end, to get a second packet, wherein $y=1, 2, \ldots, k$; repeating the above steps successively for the other (k−1) first packets in the column according to a y equal to the packet's row number respectively, to get k second packets; g is the chosen column in the system matrix, and g is among 1, 2, ..., n−k; and
   C23) adding the k second packets together to get a coded packet $p_{g,j}$ which is generated by the current ID code; and $p_{g,j}$ denoting the coded packet obtained through operations between the g-th column in the system matrix and the j-th ID code.

5. The method of claim 4, wherein the step C4) further comprises:
   C41) choosing the next ID code which is adjacent to the ID code in the step C2);
   C42) regarding the obtained ID code which step C41) chose as the current ID code, and then repeating step C2) and C3) until all the ID codes are used.

6. The methods of claim 5, wherein the step B) further comprises:
   B1) taking out the obtained first packets according to their serial number, then filling up the upper-triangle of the system matrix S line by line successively, according to the order of the columns which the elements in the system matrix lie in, to generate the upper-triangle $$\begin{bmatrix} c_1 & c_2 & \cdots & c_k \\ & c_{k+1} & \cdots & c_{2k-1} \\ & & \vdots & \vdots \\ & & & c_B \end{bmatrix};$$

wherein $B = k(k+1)/2$;
   B2) folding the obtained upper-triangle along a diagonal line to get the lower-triangle so that the system matrix is denoted as $$S = \begin{bmatrix} c_1 & c_2 & \cdots & c_k \\ c_2 & c_{k+1} & \cdots & c_{2k-1} \\ \vdots & \vdots & \vdots & \vdots \\ c_k & c_{2k-1} & \cdots & c_B \end{bmatrix};$$

the check matrix is denoted as $$P = \begin{bmatrix} P_1 \\ P_2 \\ \vdots \\ P_{n-k} \end{bmatrix} = \begin{bmatrix} p_{1,1} & p_{1,2} & \cdots & p_{1,k} \\ p_{2,1} & p_{2,2} & \cdots & p_{2,k} \\ \vdots & \vdots & \vdots & \vdots \\ p_{n-k,1} & p_{n-k,2} & \cdots & p_{n-k,k} \end{bmatrix};$$

wherein $P_1, P_2, \ldots, P_{n-k}$ are the coded packet sets obtained respectively while step C3) is repeated; and the step D) further comprises the following steps: combining the system matrix and the check matrix together to get a data matrix, wherein each row is stored in a storage node; the data matrix is denoted as $$M = \begin{bmatrix} S \\ P \end{bmatrix}.$$

7. The method of claim 1, wherein the step G) further comprises:
   G1) acquiring row number f of the failed system node, and for all surviving system node, downloading their first packets which lie in the f-th column of the system matrix;
   G2) downloading coded packets stored in the check node which are generated by the f-th column of the system matrix; doing inverse operations between the downloaded coded packets according to the ID codes, to get the first packets in the f-th column of the system matrix; and
   G3) obtaining the first packets stored in the failed nodes through the relation between the columns and rows of the system matrix.

8. The method of claim 7, wherein the step H) further comprises:
   H1) finding out the row number e of the coded matrix which the failed check node lies in, $e=1, 2, \ldots, n-k$; getting k ID codes;
   H2) downloading the e-th first packet from k system nodes respectively, to obtain data of the e-th column of the system matrix; getting the maximum value of the ID codes, $r_{max} = \max(r_1^a, r_2^a, \ldots, r_n^a)$; and
   H3) for the obtained data in the e-th column of the system matrix, coding the data according to the acquired ID codes, to obtain the packets stored in the failed node.

9. The method of claim 8 wherein the step H3) further comprises:
   H31) getting the maximum value of the ID codes, $r_{max} = \max(r_1^a, r_2^a, \ldots, r_n^a)$;
   H32) adding a given number of zeros to the head of the y-th first packet in the chosen column of the system matrix, wherein the given number equals to the y-th element value in the current ID code, while adding $r_{max} - r_y^a$ zeros to the end, to get a second packet, wherein $y = 1, 2, \ldots, k$; repeating the above steps successively for the other (k−1) first packets in the column according to a y equal to the packet's row number respectively, to get k second packets; g is the chosen column in the system matrix, and g is among 1, 2, . . . , n−k; and
   H33) adding the k second packets together to get a coded packet $p_{g,j}$ which is generated by the current ID code; and $p_{g,j}$ denoting the coded packet obtained through operations between the g-th column in the system matrix and the j-th ID code.

* * * * *